United States Patent
Noland et al.

(10) Patent No.: US 9,491,885 B2
(45) Date of Patent: Nov. 8, 2016

(54) MULTIPLE DRIVE SLED IN A STORAGE ARRAY

(71) Applicant: Seagate Technology LLC, Cupertino, CA (US)

(72) Inventors: Shawn Noland, Longmont, CO (US); Daniel Milligan, Golden, CO (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/502,717

(22) Filed: Sep. 30, 2014

(65) Prior Publication Data

US 2016/0095246 A1    Mar. 31, 2016

(51) Int. Cl.
| H05K 7/14 | (2006.01) |
| H05K 3/30 | (2006.01) |
| H05K 1/18 | (2006.01) |

(52) U.S. Cl.
CPC ............ H05K 7/1489 (2013.01); H05K 1/181 (2013.01); H05K 3/301 (2013.01); H05K 2201/10159 (2013.01); H05K 2201/10507 (2013.01)

(58) Field of Classification Search
CPC .. H05K 7/1487; H05K 7/1488; H05K 1/144; H05K 7/1445; H05K 2201/042; H05K 3/366; H05K 7/02; H05K 7/14; G11B 25/043; G11B 33/126; G11B 33/128; G11B 33/142; G06F 1/187; G06F 1/183; G06F 13/4068; G06F 13/4221; G06F 13/4282; G06F 15/161; G06F 13/00; G06F 3/0689; G06F 3/0683
USPC ........................................ 361/679.02, 679.31
See application file for complete search history.

(56) References Cited

U.S. PATENT DOCUMENTS

| 5,579,204 A | 11/1996 | Nelson et al. | |
| 6,862,173 B1 | 3/2005 | Konshak et al. | |
| 7,042,720 B1 | 5/2006 | Konshak et al. | |
| 7,200,008 B1 * | 4/2007 | Bhugra ............... | G11B 25/043 361/679.21 |
| 7,362,565 B2 | 4/2008 | Imblum | |
| 7,724,529 B2 * | 5/2010 | Oyama .................. | G06F 1/183 361/725 |
| 8,014,144 B2 | 9/2011 | Cheng et al. | |
| 8,402,196 B2 * | 3/2013 | Davis ..................... | G06F 13/00 710/300 |
| 9,001,514 B2 * | 4/2015 | Rust ........................ | H05K 7/02 361/727 |
| 2003/0081378 A1 | 5/2003 | Debbins et al. | |
| 2007/0097621 A1 * | 5/2007 | Fujie ....................... | G06F 1/186 361/679.46 |
| 2007/0230110 A1 * | 10/2007 | Starr ...................... | G11B 33/10 361/679.31 |
| 2007/0247805 A1 * | 10/2007 | Fujie ..................... | G11B 33/12 361/679.49 |
| 2009/0273896 A1 * | 11/2009 | Walker ................... | G06F 1/187 361/679.33 |
| 2011/0267761 A1 * | 11/2011 | Peng ..................... | G11B 33/128 361/679.31 |
| 2013/0094135 A1 * | 4/2013 | Davis .................... | G11B 33/128 361/679.31 |
| 2013/0152376 A1 * | 6/2013 | Corddry ............. | H05K 7/20836 29/592.1 |
| 2013/0163173 A1 * | 6/2013 | Hu ......................... | G06F 1/189 361/679.31 |

* cited by examiner

*Primary Examiner* — Courtney Smith
*Assistant Examiner* — Michael Matey
(74) *Attorney, Agent, or Firm* — Hall Estill Attorneys at Law (57) ABSTRACT

An apparatus as associated method contemplating a housing and a midplane supported by the housing having a midplane connector. A printed circuit board (PCB) having a PCB connector is selectively connectable to the midplane connector. A plurality of data storage devices are arranged on the printed circuit board in a staggered pattern, each electrically connected to the PCB connector via a respective electrical trace in the PCB.

20 Claims, 9 Drawing Sheets

MULTIPLE DRIVE SLED IN A STORAGE ARRAY

SUMMARY

Various embodiments of the present disclosure are generally directed to the use of a selectively removable and insertable sled for electrically connecting active elements, such as in a multiple device storage array.

Some embodiments of this disclosure contemplate an apparatus that includes a housing and a midplane supported by the housing, the midplane having a midplane electrical connector. A printed circuit board (PCB) having a PCB connector is selectively connectable to the midplane electrical connector. A first active element connector is arranged on the PCB so that an insertion direction of the first active element connector is substantially along a longitudinal dimension of the PCB that is operably substantially orthogonal to the midplane. A second active element connector is arranged on the PCB so that an insertion direction of the second active element connector is substantially opposite the insertion direction of the first active element connector. The PCB has substantially equivalent-length electrical traces between each of the active element connectors and the PCB connector.

Some embodiments of this disclosure contemplate an apparatus having a housing and a midplane supported by the housing having a midplane connector. A printed circuit board (PCB) having a PCB connector is selectively connectable to the midplane connector. A plurality of data storage devices are arranged on the printed circuit board in a staggered pattern, each electrically connected to the PCB connector via a respective electrical trace in the PCB.

Some embodiments of this disclosure contemplate a method that includes: obtaining a housing supporting a midplane having a midplane connector; obtaining a sled having a printed circuit board (PCB) supporting a PCB connector and a plurality of data storage device connectors each electrically connected to the PCB connector via electrical traces in the PCB; placing a first data storage device adjacent a first area of the PCB and sliding the first data storage device longitudinally along the PCB to electrically connect the first data storage device to one of the data storage device connectors; placing a second data storage device adjacent a second area of the PCB that includes part of the first area and sliding the second data storage device longitudinally along the PCB to electrically connect the second data storage device to another one of the data storage device connectors; and sliding the sled in the housing to electrically connect the PCB connector to the midplane connector.

DETAILED DESCRIPTION

The present disclosure generally relates to mounting a set of data storage devices to form a storage array.

Mass storage systems often employ multiple data storage devices which are operationally arranged to provide a relatively high data capacity memory storage space. The devices may be grouped together into a mass storage assembly (MSA) or other module that can be removably installed into a rack system (server cabinet).

Mass storage systems can take a variety of forms including servers, cloud storage modules, RAID (redundant array of independent drives) systems, extended memory systems (JBODs, or "just a box of drives"), etc. The storage systems can be accessed locally or over a network including a local area network (LAN), a wide area network (WAN), the Internet, etc. A storage enclosure can include various active elements such as storage devices, control boards, power supplies, fans, boot devices, etc.

While operable to provide highly efficient computer storage, conventional mass storage systems can be subject to a variety of limitations, including the inability to remove and replace individual active elements while maintaining the storage enclosure in a powered, operational condition ("hot swapping"), such as in the context of a service operation to replace a failed component or an upgrade operation where new and different performance elements are installed.

Accordingly, various embodiments of the present disclosure are generally directed to a removable/insertable sled for electrically connecting active elements in a multi-device storage enclosure. As explained below, the storage enclosure may be configured with a housing adapted to be mounted within a rack system. The housing supports a number of active elements including multiple storage devices, power supplies, control boards, boot devices, etc. The sled includes an electrical connector for each of the sled-mounted active elements. The sled also includes a system connector for electrically connecting the sled-mounted active elements with the system-wide active elements.

Figure 1:
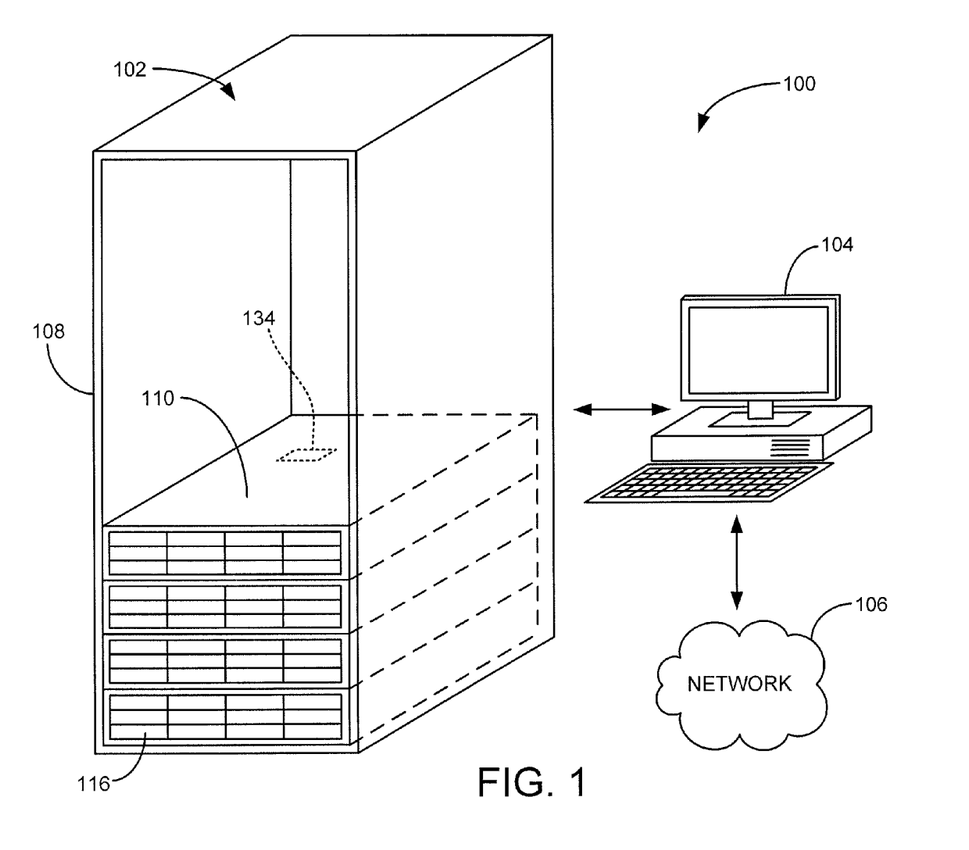
FIG. 1 is a functional representation of a networked mass storage system to illustrate a suitable operational environment for various embodiments of the present disclosure.

These and other features of various embodiments will become apparent beginning with a review of FIG. 1 which generally depicts a networked mass storage system 100 in accordance with some embodiments. The system 100 includes a storage assembly 102 coupled to a computer 104 which in turn is connected to a network 106. The computer 104 can take a variety of forms such as a work station, a local personal computer, a server, etc. The storage assembly 102 includes a server cabinet (rack) 108 and a plurality of modular storage enclosures 110.

In some embodiments, the storage rack 108 is a 42U server cabinet with 42 units (U) of storage, with each unit comprising about 1.75 inches (in) of height. The width and length dimensions of the cabinet can vary but common values may be on the order of about 19 in.×36 in. Other sizes can be used. Each storage enclosure can be a multiple of the storage units, such as 2U, 3U, 5U, etc. Fully populating the rack 108 with storage enclosures 110 can provide several Petabytes ($10^{15}$ bytes) of storage or more for the computer 104 and/or network applications.

Figure 2:
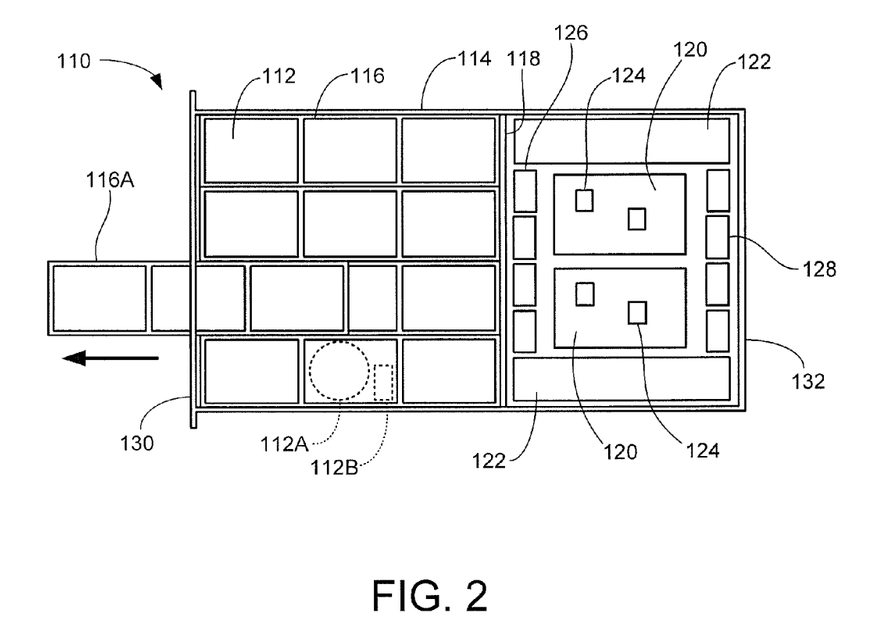
FIG. 2 is a top representation of a storage enclosure from FIG. 1.

An example configuration for a selected storage enclosure 110 is shown in FIG. 2. The storage enclosure 110 takes a 36/2U array configuration with 36 (3×4×3) data storage devices 112 in a 2U form factor height storage enclosure housing 114. A variety of other configurations can be used including storage enclosures with a total of N drives where N=12, 16, 20, 24, 30, 32, 48, etc. Other heights can be used as well, such as 3U, 4U, 5U, etc.

The storage devices 112 can take a variety of forms, such as hard disc drives (HDDs), solid-state drives (SSDs), hybrid drives, etc. Each storage device 112 includes a controller and computer memory to provide storage of user data, such as represented by rotatable disc memory 112A and controller 112B. In a cloud computing environment, data may be stored in the form of objects (partitions) of selected size and duplicated a number of times in different zones in different storage devices. It is contemplated that the storage devices 112 in FIG. 2 are 3.5 inch (in.) form factor HDDs with nominal length and width dimensions of 5.75 in.×4.0 in. Other styles and form factors of storage devices can be used, including but not limited to 2.5 in. form factor devices with nominal dimensions of 4.0 in.×2.88 in.

Removable and insertable sleds 116 are used to secure a set of storage devices 112 in the array. The sleds can be individually removed and inserted from/to the housing 114, as shown for a selected sled 116A which has been partially removed from the housing 110. The sleds 116 may include sled electronics (not separately shown) to provide status indications and other control features during enclosure operation. While the sleds 116 in these embodiments support the storage devices 112 in a horizontal orientation (e.g., the length and width dimensions of the storage devices are parallel to the overall length and width dimensions of the storage enclosure housing 114), the sleds 116 can alternatively support the storage devices 112 in a vertical orientation (e.g., "on edge" so that the length and width dimensions of the storage devices are orthogonal to the length and width dimensions of the storage enclosure).

A printed circuit board (PCB) 118 is mounted in a transverse direction across the housing 114 to provide electrical interconnection paths for the various storage devices 112 and sled electronics. In these depicted embodiments the PCB 118 is located at a medial location within the enclosure housing 114, and such a construction is commonly referred to as a midplane 118. In alternative equivalent embodiments the PCB 118 can otherwise be located at or toward the rear of the enclosure housing 114, what is commonly referred to as a backplane 118. For purposes of this disclosure and meaning of the claims the term "midplane" generally refers to a transverse PCB such as including the depicted midplane, a backplane, a combination, and the like. The midplane 118 may take the form of a fixed multi-layer printed circuit board assembly (PCBA) with various electrical connectors, signal traces and vias to establish the necessary electrically conductive signal and power paths.

Alternatively, the midplane may take a flexible configuration in which flex circuits (e.g., cables, etc.) are used to maintain electrical interconnection with the storage devices and sleds. When a rigid midplane is used, extension of a sled (e.g., sled 116A) will generally result in the associated storage devices on the removed sled being electrically disconnected from the system. Extension of a sled using a flexible midplane may allow the associated storage devices in the removed sled to remain electrically connected.

Other active elements in the storage enclosure 110 of FIG. 2 include dual redundant control boards 120. The control boards 120 can take a variety of forms depending on the configuration of the storage enclosure 110, such as a server, a network switch, a router, a RAID controller, etc. The multiple control boards can be used in a dual mode operation to support failover and failback operations, or as a master/slave arrangement so that one control board provides control operations and the other board operates in a standby mode ready to take over operation should a fault be detected in the main control board.

Dual redundant power supplies are represented at 122. The power supplies 122 provide electrical power for the control boards 120 and other active elements of the storage enclosure 110 such as the storage devices 112. The electrical power is supplied at suitable voltage levels (e.g., 3V, 5V, 12V, etc.). Redundancy is provided such that each power supply 122 is rated to supply power for the entire enclosure, should the remaining power supply or supplies be temporarily taken off line.

The control boards 120 include one or more integrated circuit (IC) devices 124. The IC devices 124 generate significant amounts of heat during operation, requiring the use of a convective cooling airflow to maintain the devices in a suitable temperature range. Similarly, the storage devices 112 can generate significant amounts of heat during operation depending upon system loading.

Accordingly, the storage enclosure 110 of FIG. 2 further incorporates a number of electrical fans. Forward located fans 126 are provisioned near the midplane 118 at an intermediate location within the storage enclosure housing 114, and rearward located fans 128 are provisioned at the rear of the storage enclosure housing 114. The respective fans 126, 128 may be nominally identical or may be provided with different operational characteristics.

Although not separately denoted in FIG. 2, it will be understood that vent apertures are provisioned in respective front and end facing surfaces 130, 132 of the storage enclosure housing 114. The apertures permit cooling airflow from a cold inlet to be drawn into the front of the housing 114 so as to flow adjacent the storage devices 112 and midplane 118, through the front fans 126, adjacent the control boards 120 and power supplies 122, and through the rear fans 128 out the rear of the housing to the warm aisle. The power supplies 122 may similarly incorporate fans to direct airflow through the power supply housing.

While such an arrangement can be operable, the location of the front fans 126 within the intermediate portion of the housing can present challenges from a servicing standpoint should one or more of the fans require replacement. As noted above, the use of the removable/insertable sleds 116 permit relatively easy access to the individual storage devices 112. Similarly, the other active elements such as the control boards 120, the power supplies 122 and the rear fans 128 can be easily accessed through the rear side 132 of the housing 114.

Due to clearance and interconnectivity constraints, however, the front fans 126 are not easily accessible from either the front or rear sides 130, 132 of the housing 114. In the event of a failure of one or more of the front fans 126, one service option is to remove the rear fans 128 and one or both of the control boards 120 from the rear of the housing 114 in order to reach in, remove and replace the failed fan(s) 126. This requires the storage enclosure to be powered down for a significant amount of time and provides a risk that one or more of the active components may be damaged or reinstalled improperly.

Although not depicted, another service option is to mount the storage enclosure 110 on a set of rails, allowing the storage enclosure to be moved forward from the storage cabinet 108 (see FIG. 1). A service door (such as represented at 134 in FIG. 1) in the top cover of the storage enclosure housing 114 can then be opened to provide access to the forward fans 126. This approach is also associated with a number of difficulties, including the fact that the storage enclosure will likely need to be powered down prior to extension. Depending on the size and number of storage devices within the enclosure, the enclosure can also be unwieldy from a weight standpoint (some storage enclosures can weigh several hundred pounds), making such service operations difficult to carry out in a fast and efficient manner.

Figure 3:
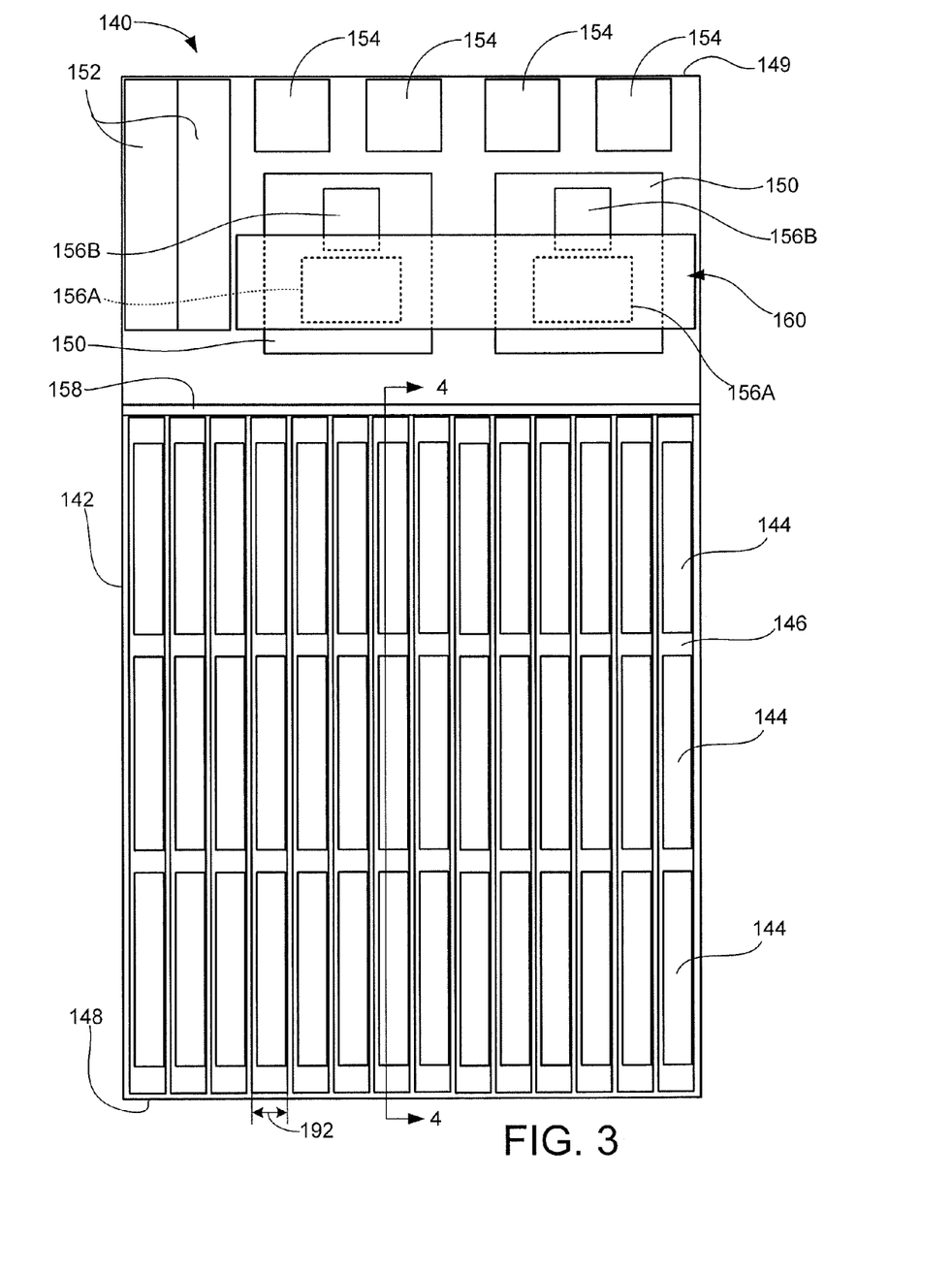
FIG. 3 is a top representation of another storage enclosure from FIG. 1.

FIG. 3 is a top plan representation of a storage enclosure 140 constructed and operated in accordance with embodiments of the claimed invention. The storage enclosure 140 utilizes various active elements such as discussed above, and is configured for mounting in a storage cabinet such as 108 in FIG. 1.

The storage enclosure 140 includes an enclosed storage housing 142. In some embodiments, the storage housing 142 has a 3U height and houses a total of 42 data storage devices 144 (14×3×1). The data storage devices 144 are contemplated as comprising 3.5 in. form factor HDDs, although other styles, types, sizes, numbers and orientations of storage devices can be used.

The storage devices are arranged in a vertical orientation, with groups of three (3) devices being supported by individual sleds 146. A total of 14 sleds are provided, with the sleds being configured for removing from a front surface 148 of the housing to provide access to the devices 144 during service events as discussed above.

Access is provided from a rear surface 149 of the housing 142 to facilitate servicing of other active elements of the storage enclosure 140, including dual redundant control boards 150, power supplies 152 and fans 154. The fans 154 are electrically powered fans with rotatable fins configured to establish airflow at a selected rate, and collectively form a fan assembly. Each of the control boards 150 electrically and mechanically support a number of active elements, such as IC devices 156A and 156B. The control board can manage the storage and retrieval of data from the storage devices 144 with a host device.

A midplane 158 is supported in a transverse direction across a width direction of the housing 142 and provides electrical and mechanical interconnection of the various active elements of the enclosure 140. The midplane 158 is a rigid midplane having a multi-layer printed circuit board assembly (PCBA) which supports various connectors and conductive traces (not separately shown) to interconnect the various active elements. Other configurations, including flexible midplanes, can be used.

It will be appreciated that a number of other elements can be incorporated into the storage enclosure 140 such as sled electronics, monitoring circuits, LED status indicators, cabling, boot devices, mechanical support structures, etc. Such elements have been omitted from FIG. 3 for simplicity of illustration.

Figure 4:
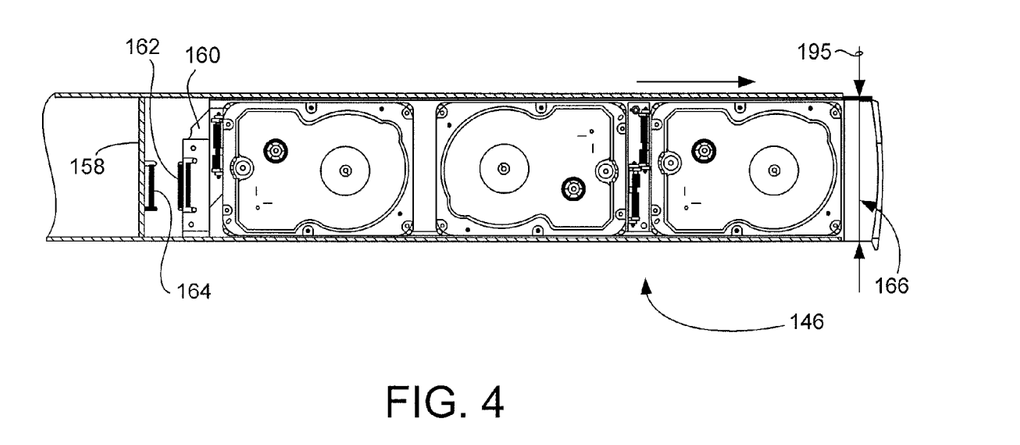
FIG. 4 is an elevational representation of a sled in the storage enclosure of FIG. 3.

FIG. 4 is a cross sectional depiction taken along the section line 4-4 in FIG. 3, but depicting the sled 146 partially removed within the opening defined by the storage housing 142 in the direction of the arrow, as is similarly depicted by the partially removed sled 116A in FIG. 2. In these illustrative embodiments the sled 146 includes a printed circuit board (PCB) 160 having a PCB connector 162 (sometimes referred to as a system connector) that is selectively connectable to a midplane electrical connector 164 supported by the midplane 158. When the sled 146 is removed then the PCB connector 162 is electrically disconnected from the midplane connector 164 in these illustrative embodiments, although the contemplated embodiments are not so limited. Although not depicted, in alternative equivalent embodiments the midplane electrical connection can be flexible, as disclosed herein, to provide for maintaining the electrical connection during an extension of the sled 146.

Figure 5:
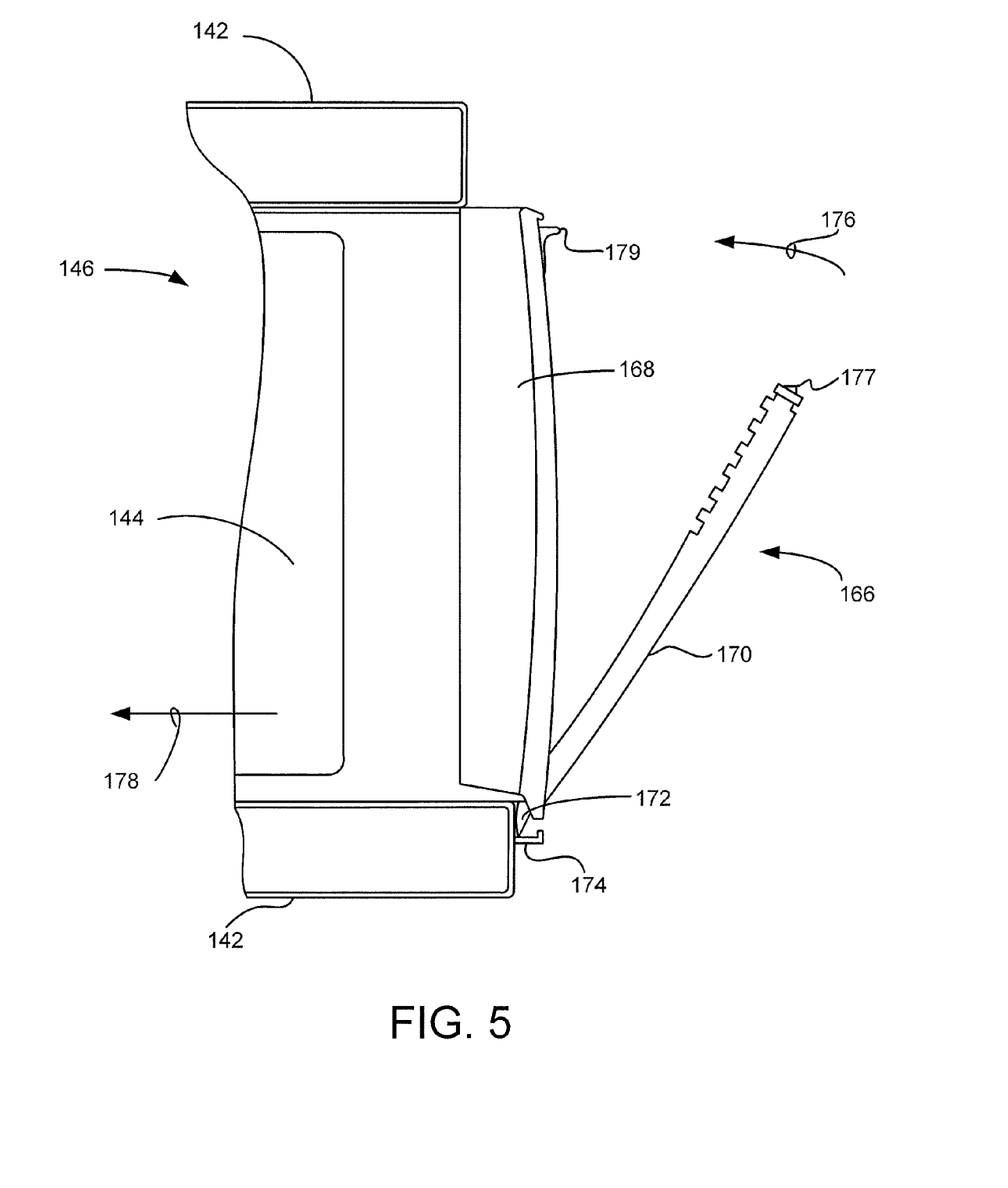
FIG. 5 is an elevational representation of the actuator at the exposed end of the sled in FIG. 4.

The sled 146 preferably includes an actuator 166 at the exposed end for positively securing the sled 146 at the fully inserted position and thereby robustly connecting the PCB connector 162 and the midplane connector 164 together. FIG. 5 is an enlarged elevational depiction of the actuator 166 that has a body 168 affixed to the sled 146 and thereby fixed in movement therewith. The actuator 166 also has a lever 170 that is journaled to the body 168 for selective pivotal movement. In the outwardly pivoted position of the lever 170 depicted, a cam 172 is engageable within a protuberant strike 174 formed by or otherwise supported by the storage housing 142. Counterclockwise rotation of the lever 170 in the direction depicted by arcuate arrow 176 forces the cam 172 against the strike 174 to impart an insertion force of the PCB connector 162 (FIG. 4) into electrical connection with the midplane connector 164 in the direction depicted by linear arrow 178. In the fully-closed position of the lever 170 a detent 177 lockingly engages a spring-loaded button 179. The button 179 has a protuberant knob for the user to lift upwardly to unlock the lever 170 for removing the sled 146.

Figure 6:
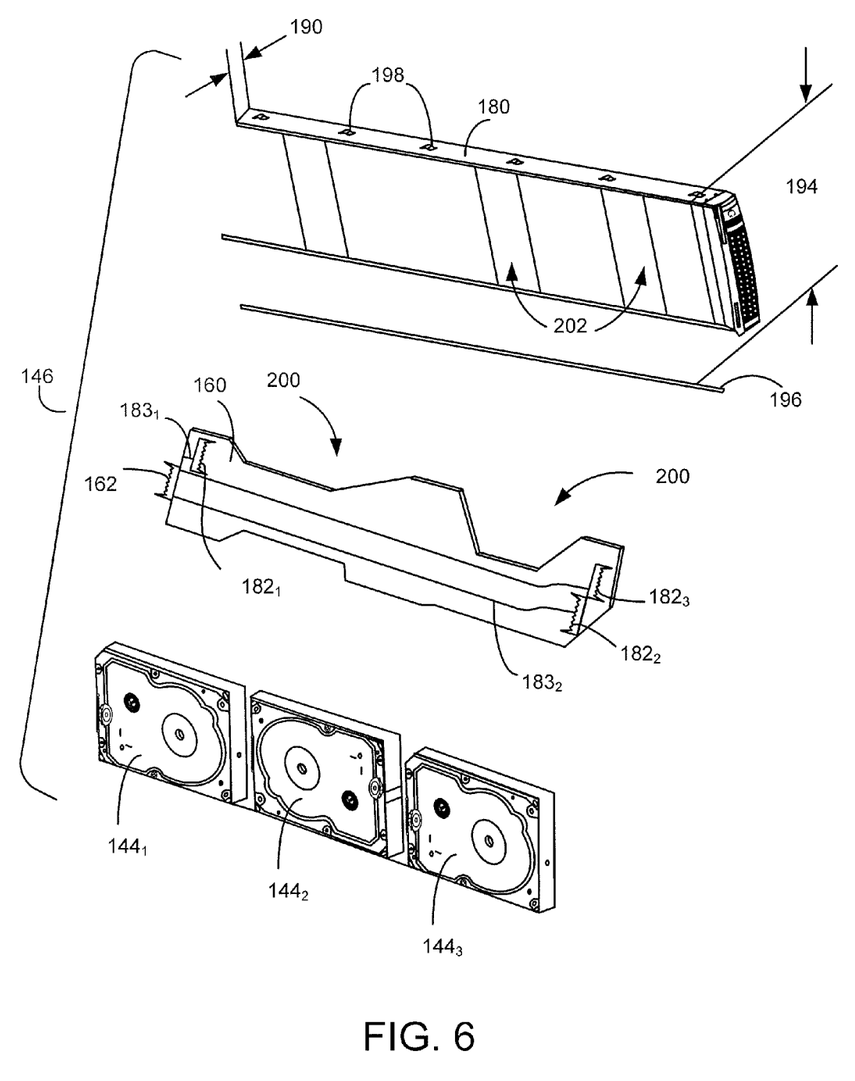
FIG. 6 is an exploded isometric representation of the sled of FIG. 4.

FIG. 6 is an exploded isometric depiction of the sled 146 in FIG. 4. The sled 146 includes a rigid frame 180, such as can be constructed of sheet metal formed into a cross sectional C-shape as depicted. The rigid frame 180 is sized to slide within an opening defined by the storage housing 142. That is, a width 190 of the rigid frame 180 is sized to provide a closely mating fit within a width 192 (FIG. 3) between adjacent partitions (or other guides) in the storage housing 142. Similarly, a height 194 of the rigid frame 180 is sized to provide a closely mating fit within a height 195 (FIG. 4) between the top and bottom of the storage housing 142. The close mating fit provides for alignment of the PCB connector 162 with the midplane connector 164.

Figure 7:
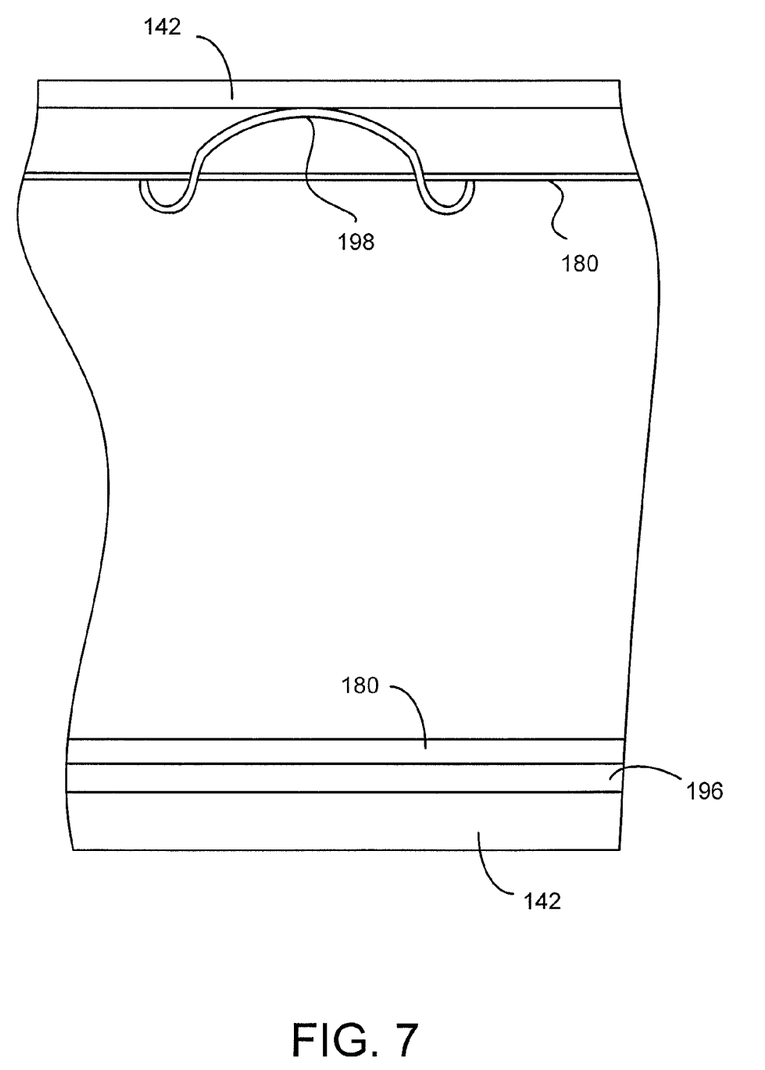
FIG. 7 is an enlarged representation of a portion of FIG. 4 depicting the bearing member providing a datum surface urged against the storage enclosure.

Staying with FIG. 6, in these illustrative embodiments the height includes attachment of a friction-reducing and wear-resistant bearing member 196 that facilitates the extension and insertion of the sled 146 without undue wear and tear and creation of debris. For example, without limitation, the bearing member 196 can be constructed of an acetyl resin polymer marketed by DuPont under the trade name Delrin®. In these illustrative embodiments the height also includes attachment of a number of crowder members 198 that are engaged via compression between the rigid frame 180 and the top of the storage housing 142. FIG. 7 is an enlarged portion of FIG. 4 better depicting how the compression of the crowder member 198 imparts a force urging the bottom surface of the bearing member 196 against the bottom of the storage housing 142. That advantageously provides a datum reference for precisely aligning the PCB connector 162 with the midplane connector 164 for electrically connecting them together as the result of inserting the sled 146 into the storage housing 142.

Returning momentarily to FIG. 6, the frame 180 provides structural support for attachment of the PCB 160 and active elements electrically connected to the PCB 160, such as the three data storage devices 144 in these illustrative embodiments. In these depicted embodiments, the PCB 160 has three data storage device connectors 182, each individually connectable to one of the data storage devices 144. Electrical traces 183 in the PCB 160 electrically connect each of the data storage device connectors 182 to the PCB connector 162. The PCB 160 preferably has a number of notches 200 that operably align with notches 202 in the rigid frame 180 to reduce the coverage over the data storage devices 144, increasing the exposure of the data storage devices 144 to the convective cooling air flow moving past the sled 146 within the storage housing 142.

Figure 8:
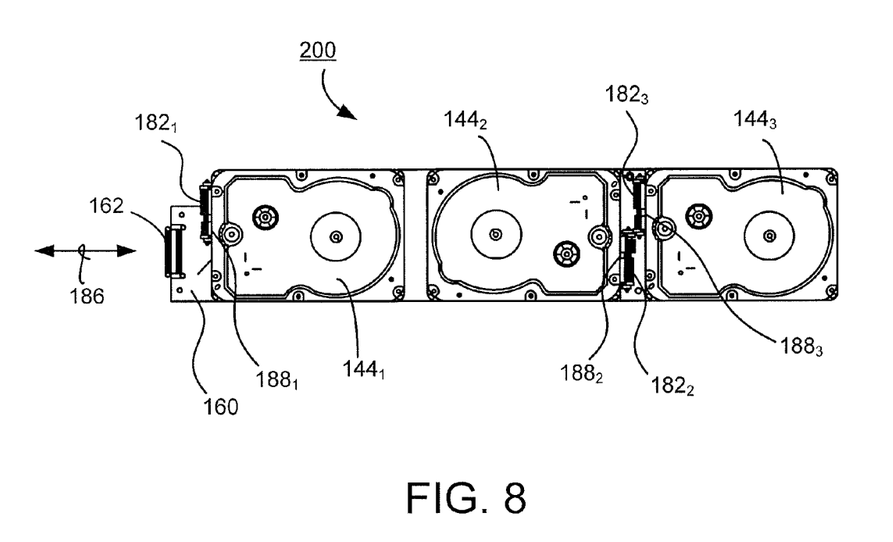
FIG. 8 is an elevational representation of the PCB assembly in the sled of FIG. 4.

FIG. 8 depicts a staggered PCB assembly 200 that includes the data storage devices 144 electrically connected to the respective data storage device connectors 182. The plurality of data storage devices 144 is arranged on the PCB 160 in a staggered pattern, meaning they are not all supported in the same orientation. Particularly, the data storage device $144_2$ is staggered with respect to the data storage devices $144_1$, $144_3$. That is, the data storage device $144_2$ has a connector end $188_2$ that is operably insertable along the PCB longitudinal dimension, depicted by longitudinal axis 186, toward the right as depicted in FIG. 8 into electrical connection with the data storage device connector $182_2$. Opposingly, the data storage device $144_3$ has a connector end $188_3$ that is operably insertable along the PCB longitudinal dimension toward the left as depicted in FIG. 8 into electrical connection with the data storage device connector $182_3$. In this depicted staggered arrangement the connector ends $188_2$, $188_3$ point toward each other so that they oppose each other when inserted into the data storage device connectors $182_2$, $182_3$. With respect to data storage devices $144_1$, $144_2$ the staggered arrangement includes the connector ends $188_1$, $188_2$ pointing away from each other. In any event, for purposes of this disclosure and meaning of the claims the term "staggered arrangement" in context means the active elements, such as the data storage devices 144 in these illustrative embodiments, are arranged in different orientations on the PCB 160.

Figure 9:
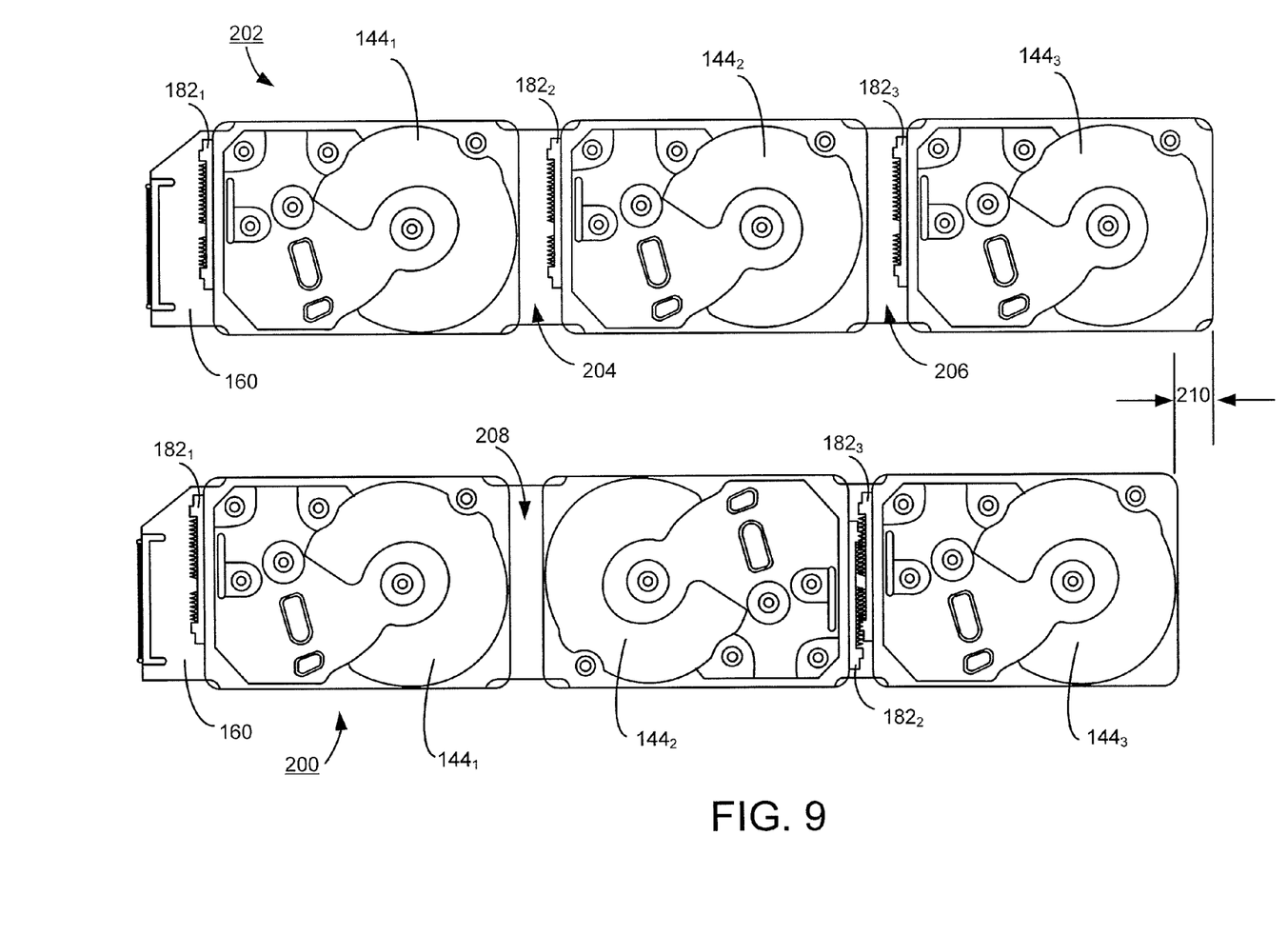
FIG. 9 is an elevational representation comparing the staggered arrangement of FIG. 8 with a non-staggered arrangement.

FIG. 9 is a side-by-side comparison of the staggered PCB assembly 200 of FIG. 8 and a non-staggered PCB assembly 202. That is, by definition the PCB assembly 202 is not staggered because all of the data storage devices 144 are oriented in the same direction. In the non-staggered PCB assembly 202 an insertion clearance area 204 is necessary to provide clearance for initially placing the data storage device $144_1$ over the PCB 160 and then sliding the data storage device $144_1$ to the left in order to electrically connect to the data storage device connector $182_1$. Similarly, another insertion clearance area 206 is necessary to provide clearance for initially placing the data storage device $144_2$ over the PCB 160 and then sliding the data storage device $144_2$ to the left in order to electrically connect to the data storage device connector $182_2$.

However, the staggered PCB assembly 200 only requires one insertion clearance area 208. The data storage device $144_1$ is placed over an area of the PCB 160 and then slid to the left as in the non-staggered PCB assembly 202. The data storage device $144_2$ is placed over an area of the PCB 160 that includes part of the area previously used to insert the data storage device $144_1$. By sharing the same insertion clearance area 208 for two data storage devices $144_1$, $144_2$, the overall length of the staggered PCB assembly 200, and the sled 146 using the staggered PCB assembly 200, can be reduced by the longitudinal dimension of the unnecessary second insertion clearance area, as depicted by length-reduction 210. The reduced sized of the sled 146 advantageously provides additional margin for miniaturization objectives. Although only three data storage devices 144 are depicted in these illustrative embodiments, the staggered arrangement disclosed herein offers even further reductions in size for sleds that have more than three data storage devices 144.

It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
a housing;
a midplane supported by the housing, the midplane having a midplane electrical connector;
a printed circuit board (PCB) having a PCB connector that is selectively connectable to the midplane electrical connector,
a first active element connector fixed to first electrical traces of the PCB so that a first insertion direction of a first active element into electrical connection with the first active element connector is substantially along a longitudinal axis of the PCB and substantially orthogonal to the midplane;
a second active element connector fixed to second electrical traces of the PCB so that a second insertion direction of a second active element into electrical connection with the second active element connector is substantially opposite the first insertion direction, and lengths of the first and second electrical traces are substantially equivalent.

2. The apparatus of claim 1 comprising a third active element connector fixed to third electrical traces on the PCB so that a third insertion direction of a third active element into the third active element connector is the same as one of the first and second insertion directions.

3. The apparatus of claim 2 comprising a plurality of active elements electrically connected to the active element connectors on the PCB.

4. The apparatus of claim 1 wherein the PCB is supported by a rigid frame that is slidable within an opening defined by the housing, the rigid frame sized to operably align the PCB connector with the midplane connector.

5. The apparatus of claim 4 wherein the rigid frame comprises a friction-reducing bearing surface contacting the housing during the sliding of the PCB connector in relation to the midplane connector.

6. The apparatus of claim 5 wherein the rigid frame comprises an actuator having a lever that operably imparts an insertion force urging the PCB connector into electrical connection with the midplane connector.

7. The apparatus of claim 5 wherein the rigid frame and the PCB define aligned notches reducing coverage of the active elements.

8. The apparatus of claim 5 wherein the rigid frame supports a compressible crowder member opposite the bearing surface.

9. An apparatus comprising:
a housing;
a midplane supported by the housing and having a midplane connector;

a printed circuit board (PCB) having a PCB connector that is selectively connectable to the midplane connector; and a plurality of data storage devices arranged on the printed circuit board in a staggered pattern, each electrically connected to the PCB connector via a respective electrical trace of the PCB.

10. The apparatus of claim 9 wherein the PCB has first and second data storage device connectors, a first data storage device of the plurality having a connector end that is operably insertable in a first direction into electrical connection with the first data storage device connector and a second data storage device of the plurality having a connector end that is operably insertable in a different second direction into electrical connection with the second data storage device connector, the first direction substantially opposite the second direction.

11. The apparatus of claim 10 wherein the first and second directions are substantially parallel to a longitudinal axis of the PCB that is operably substantially orthogonal to the midplane.

12. The apparatus of claim 10 wherein the connector ends of the first and second data storage devices oppose each other when inserted in the data storage device connectors.

13. The apparatus of claim 10 wherein the PCB is supported by a rigid frame that is slidable within an opening defined by the housing, the rigid frame sized to operably align the PCB connector with the midplane connector.

14. The apparatus of claim 13 wherein the rigid frame comprises a friction-reducing bearing surface contacting the housing during the sliding of the PCB connector in relation to the midplane connector.

15. The apparatus of claim 14 wherein the bearing surface comprises a polymer material.

16. The apparatus of claim 13 wherein the rigid frame comprises an actuator having a lever that operably imparts an insertion force urging the PCB connector into electrical connection with the midplane connector.

17. The apparatus of claim 13 wherein the rigid frame and the PCB define aligned notches reducing coverage of the data storage devices.

18. The apparatus of claim 14 wherein the rigid frame supports a compressible crowder member opposite the bearing surface.

19. A method comprising:
obtaining a housing supporting a midplane having a midplane connector;
obtaining a sled having a printed circuit board (PCB) supporting a PCB connector and a plurality of data storage device connectors each fixed to electrical traces of the PCB;
sliding a first data storage device in a first insertion direction into electrical connection with one of the data storage device connectors;
sliding a second data storage device in a second insertion direction opposite the first insertion direction into electrical connection with another one of the data storage device connectors; and
sliding the sled in the housing to electrically connect the PCB connector to the midplane connector.

20. The apparatus of claim 3 wherein the active elements are operably aligned along the longitudinal axis.

* * * * *